United States Patent
Akamine et al.

(10) Patent No.: US 8,415,954 B2
(45) Date of Patent: Apr. 9, 2013

(54) APPARATUS FOR CALCULATING POLARIZATION VOLTAGE OF SECONDARY BATTERY AND APPARATUS FOR ESTIMATING STATE OF CHARGE OF THE SAME

(75) Inventors: Naoshi Akamine, Hamamatsu (JP); Kimiaki Ishidu, Hamamatsu (JP)

(73) Assignee: Primearth EV Energy Co., Ltd., Kosai-shi (JP)

( * ) Notice: Subject to any disclaimer, the term of this patent is extended or adjusted under 35 U.S.C. 154(b) by 354 days.

(21) Appl. No.: 12/955,290

(22) Filed: Nov. 29, 2010

(65) Prior Publication Data

US 2011/0156713 A1 Jun. 30, 2011

(30) Foreign Application Priority Data

Dec. 25, 2009 (JP) ................. 2009-294440

(51) Int. Cl.
*G01N 27/416* (2006.01)

(52) U.S. Cl.
USPC ........... 324/433; 324/426; 324/430; 324/432; 320/132; 320/134; 320/136; 903/903; 903/907

(58) Field of Classification Search .......... 324/425–434; 320/132, 134–136; 903/903, 907
See application file for complete search history.

(56) References Cited

U.S. PATENT DOCUMENTS

| | | | |
|---|---|---|---|
| 6,621,250 B1 | 9/2003 | Ohkubo | |
| 7,154,247 B2 * | 12/2006 | Kikuchi et al. | ............... 320/132 |
| 7,456,612 B2 * | 11/2008 | Murakami | ................... 320/132 |
| 2004/0257087 A1 | 12/2004 | Murakami | |
| 2008/0157777 A1 | 7/2008 | Yamabe | |
| 2009/0024338 A1 * | 1/2009 | Suzuki | ........................ 702/63 |

FOREIGN PATENT DOCUMENTS

| | | |
|---|---|---|
| JP | 10-319100 A | 12/1998 |
| JP | 2000-258514 A | 9/2000 |
| JP | 2001-97150 A | 4/2001 |
| JP | 2003068370 A | 3/2003 |
| JP | 2003197275 A | 7/2003 |
| JP | 2008180692 A | 8/2008 |

\* cited by examiner

*Primary Examiner* — Huy Q Phan
*Assistant Examiner* — Thang Le
(74) *Attorney, Agent, or Firm* — Christensen O'Connor Johnson Kindness PLLC

(57) ABSTRACT

There is provided an apparatus that calculates a polarization voltage of a secondary battery. A temperature sensor detects a temperature of the secondary battery; a voltage sensor detects a voltage of the secondary battery; and a current sensor detects an electric current of the secondary battery. A battery ECU calculates a polarization voltage based on the electric current and adaptively sets an upper limit value and a lower limit value of the polarization voltage according to a temperature characteristic of the secondary battery. The calculated polarization voltage is compared with an upper limit value and a lower limit value, whereby the polarization voltage is corrected. An SOC is estimated based on the corrected polarization voltage.

10 Claims, 6 Drawing Sheets

APPARATUS FOR CALCULATING POLARIZATION VOLTAGE OF SECONDARY BATTERY AND APPARATUS FOR ESTIMATING STATE OF CHARGE OF THE SAME

PRIORITY INFORMATION

This application claims priority to Japanese Patent Application No. 2009-294440, filed on Dec. 25, 2009, which is incorporated herein by reference in its entirety.

BACKGROUND

1. Technical Field

The present invention relates to an apparatus for calculating a polarization voltage of a secondary battery and an apparatus for estimating a state of charge (SOC) of the secondary battery based on the calculated polarization voltage.

2. Background Art

Each of motor vehicles that is supplied with driving force from an electric motor, such as a pure electric vehicle and a hybrid electric vehicle, is equipped with a secondary battery. The electric motor is driven by electric power stored in the secondary battery. The motor vehicle has a function of letting the electric motor work as an electric generator during regenerative braking operation; namely, during braking of the vehicle and convert kinetic energy of the vehicle into electric energy, thereby activating a brake. The thus-converted electric energy is stored in the secondary battery and reused at the time of performance of acceleration or in a like situation.

When the secondary battery experiences overdischarging operation or overcharging operation, battery performance of the battery is deteriorated. For this reason, there is a necessity for regulating charging or discharging operation by grasping the state of charge (SOC) of the secondary battery. In particular, a hybrid electric vehicle often control the state of charge in such a way that the SOC comes into an approximate midrange (50% to 60%) between a fully charged state (100%) and a fully empty state (0%) in order to let the secondary battery accept regenerated power and make the secondary battery able to immediately feed electric power to the electric motor on request. In this case, more accurate detection nor estimation of the SOC is expected.

A disclosure of JP 10-319100 A includes: observing a battery current obtained in the course of driving operation and thereby estimating a degree of polarization by predicting a local change in concentration of an electrolyte; and also estimating the state of charge based on a voltage-current characteristic that has been measured by waiting for a chance of influence of polarization becoming low, by reference to a map of a correction factor and a voltage value appropriate to a state of charge.

A disclosure of JP 2000-258514 A includes taking into account a polarization electromotive force voltage which is included in electromotive force and which stems from polarization of a battery cell when an SOC is determined on the basis of whether or not the electromotive force voltage that has been obtained by subtracting, from a voltage, a voltage drop in a battery attributable to internal resistance of the battery has become equal to or greater/less than a predetermined value.

A disclosure of JP 2001-97150 A includes: controlling a generated output from an electric generator in such a way that an index of polarization in a battery becomes no less than a lower limit value and no greater than an upper limit value and estimating an SOC of the battery on the basis of such a polarization index.

A disclosure of JP 2003-68370 A includes performing more accurate estimated calculation of a polarizing electromotive voltage by taking into account mutually-different polarization characteristics of battery constituent members making up a battery.

A disclosure of JP 2003-197275 A includes: determining a polarization voltage, by reference to a reference table, based on an amount of change in filtered, integrated capacity; subtracting the polarization voltage from an effective no-load voltage, to thus determine electromotive force of a battery; and estimating an SOC based on the battery electromotive force by reference to the reference table.

A disclosure of JP 2008-180692 A includes: subtracting a polarization voltage from a no-load voltage, to thus determine electromotive force; making a correction to the electromotive force calculated this time in such a way that an amount of difference between a previously-calculated electromotive force and the electromotive force calculated this time does not exceed a predetermined limiting value; and estimating an SOC based on the thus-corrected electromotive force.

As mentioned above, it is possible to calculate a no-load voltage of the secondary battery; determine electromotive force of the secondary battery by means of subtracting a polarization voltage from the no-load voltage, and estimate the state of charge (SOC) of the secondary battery based on the thus-calculated electromotive force of the secondary battery. However, as is obvious from the above calculation processes, the accuracy of calculation of the polarization voltage comes to exert great influence on the accuracy of calculation of the SOC. A disclosure of JP 2001-97150 A includes controlling an electric generator in such a way that a polarization index falls within a range between the lower limit value and the upper limit value and estimating an SOC under the condition. A characteristic of the secondary battery can change according to a temperature, or the like. There is no disclosure of such a characteristic of the secondary battery being taken into account at the time of calculation of a polarization voltage. Further, when a polarization voltage is calculated based on an electric current flowing through the secondary battery, it may be the case where an erroneous current value may be acquired because of an error in a measured current value itself or a lag in measurement timing. If an SOC is calculated based on the polarization voltage calculated based on the erroneous current value, there will arise a case where a secondary battery will undergo overcharging or overdischarging.

SUMMARY

The present invention provides an apparatus that calculates a polarization voltage of a secondary battery, which will act as a precondition to estimating an SOC, by taking into account a characteristic of a secondary battery.

The present invention provides a polarization voltage calculation apparatus that calculates a polarization voltage of a secondary battery and that is characterized by comprising: polarization voltage calculation means that calculates a polarization voltage based on an electric current flowing into the secondary battery; threshold value setting means that sets a threshold value for the polarization voltage; and polarization voltage correction means that corrects the polarization voltage by comparing the calculated polarization voltage with the threshold value, wherein the threshold value is set according to a temperature characteristic of the secondary battery in such a way that an absolute value of the threshold value becomes smaller as a temperature increases.

In one embodiment of the present invention, the threshold value is also set according to a previous state of charge (SOC) of the secondary battery in such a way that an absolute value of the threshold value becomes smaller when the previous state of charge (SOC) is relatively in low and high ranges than in a midrange.

Further, in one embodiment of the present invention, the threshold value is also set according to a terminal voltage of the secondary battery in such a way that an absolute value of the threshold value becomes smaller when the terminal voltage is relatively in the low and high ranges than in the midrange.

Moreover, in one embodiment of the present invention, the polarization voltage correction means replaces the polarization voltage with the threshold value when the calculated polarization voltage exceeds an absolute value of the threshold value, and maintains the polarization voltage intact when an absolute value of the calculated polarization voltage is equal to the threshold value or less.

Furthermore, in one embodiment of the present invention, the threshold value includes a charge-side threshold value and a discharge-side threshold value.

The present invention also provides an apparatus that estimates a state of charge (SOC) of a secondary battery and that is characterized by comprising: polarization voltage calculation means that calculates a polarization voltage based on an electric current flowing into the secondary battery; threshold value setting means that sets a threshold value for the polarization voltage; polarization voltage correction means that corrects the polarization voltage by comparing the calculated polarization voltage with the threshold value; no-load voltage calculation means that calculates a no-load voltage representing a terminal voltage of the secondary battery acquired when an electric current flowing into the secondary battery is zero; electromotive force calculation means that calculates electromotive force of the secondary battery based on the calculated no-load voltage and the calculated polarization voltage; and SOC calculation means that calculates the state of charge (SOC) of the secondary battery based on the calculated electromotive force, wherein the threshold value is set according to a temperature characteristic of the secondary battery in such a way that an absolute value of the threshold value becomes smaller as a temperature increases.

According to the present invention, the polarization voltage of the secondary battery can be calculated with high accuracy. Further, according to the present invention, the state of charge (SOC) of the secondary battery can be estimated by use of the polarization voltage calculated with high accuracy.

The invention will be more clearly comprehended by reference to an embodiment provided below. However, the scope of the invention is not limited to the embodiment.

BRIEF DESCRIPTION OF THE DRAWINGS

A preferred embodiment of the present invention will be described in detail by reference to the following drawings, wherein.

DETAILED DESCRIPTION

An embodiment of the present invention is hereunder described by reference to the drawings while there is taken as an example a case where a secondary battery is mounted in a hybrid electric vehicle. The present invention, however, is not limited to a case where the secondary battery is mounted in the hybrid electric vehicle and can also be applied likewise to another pure electric vehicle equipped with a motor generator as a drive source.

Figure 1:
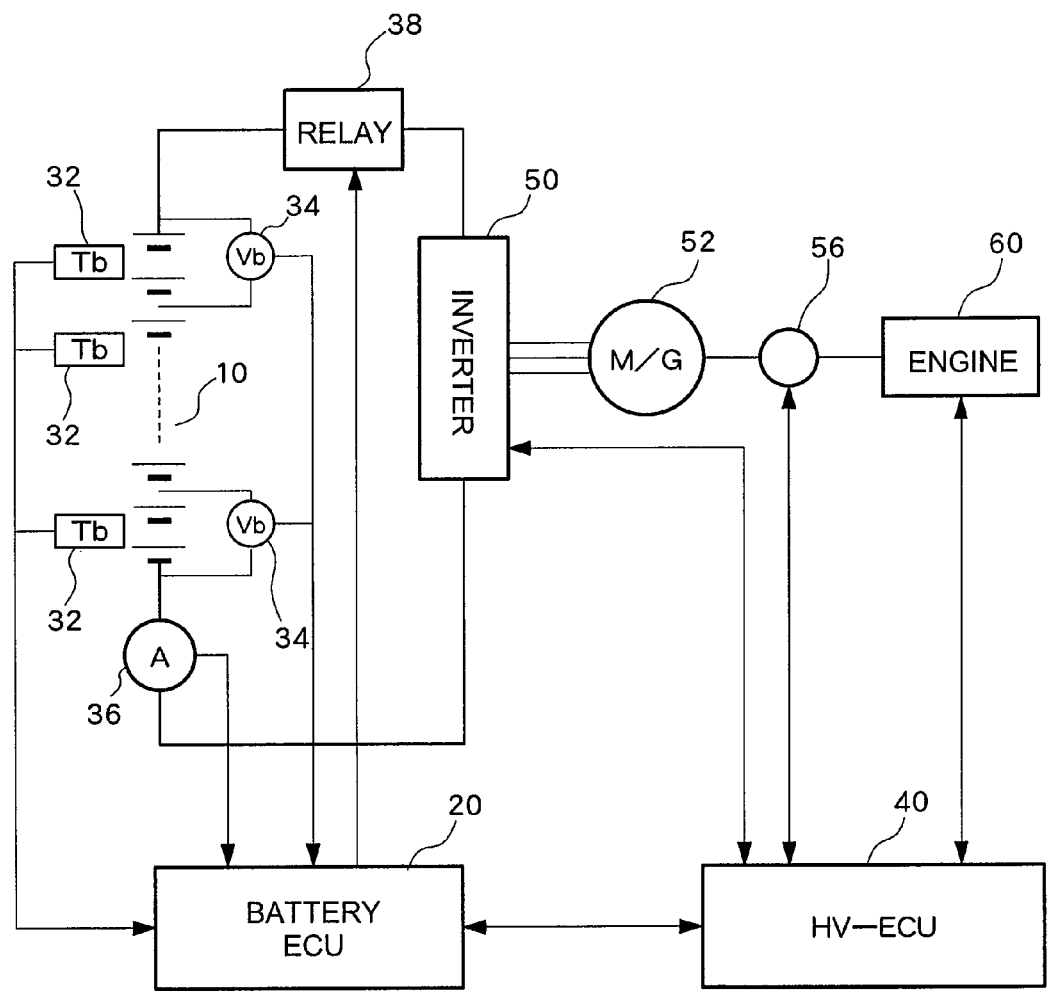
FIG. 1 is a general schematic diagram of a hybrid electric vehicle of an embodiment of the present invention.

FIG. 1 shows a general configuration of a hybrid electric vehicle. A battery electronic control unit (a battery ECU) 20 receives from a secondary battery 10 data pertaining to a battery voltage, a battery temperature, and the like; estimates an SOC of the secondary battery 10; and outputs the thus-estimated SOC and the data, such as data pertaining to the battery voltage, the battery temperature, and the like, to a hybrid electronic control unit (HV-ECU) 40. The HV-ECU 40 controls an inverter 50, a driving force distribution mechanism 56, and an engine 60.

The secondary battery 10 is constituted by connecting a plurality of battery blocks in series. Each of the battery blocks is constituted by electrically connecting a plurality of battery modules in series, and each of the battery modules is constituted by electrically connecting a plurality of cells in series. The secondary battery 10 is; for instance, a nickel-metal hydride battery or a lithium ion battery.

The secondary battery 10 is connected to a motor generator (M/G) 52 by way of a relay 32 and an inverter 50. The motor generator 52 is connected to the engine 60 by way of the driving force distribution mechanism 56 including a planetary gear mechanism.

A temperature sensor 32 is provided at, at least, one location in the secondary battery 10 and detects a battery temperature Tb of a predetermined area of the secondary battery 10. When the temperature sensor 32 is provided in numbers, it is preferable to take; for instance, a plurality of battery blocks having comparatively close temperatures as one group and to place one temperature sensor 32 on a per-group basis.

A voltage sensor 34 is provided for each battery block and detects a terminal voltage Vb of each of the battery blocks.

A current sensor 36 detects a charge/discharge current I flowing into the secondary battery 10.

Temperature data Tb detected by the temperature sensor 32, terminal voltage data Vb detected by the voltage sensor 34, and current data I detected by the current sensor 36 are fed to a battery ECU 20 in a predetermined sampling cycle of; for instance, 100 msec. The temperature data, the terminal voltage data, and the current data that are sequentially detected at respective sampling timings are taken as Tb(n), Vb(n), and I(n), respectively. The battery ECU 20 estimates an SOC of the secondary battery 10, with elapse of time, based on the data output from the respective sensors.

Figure 2:
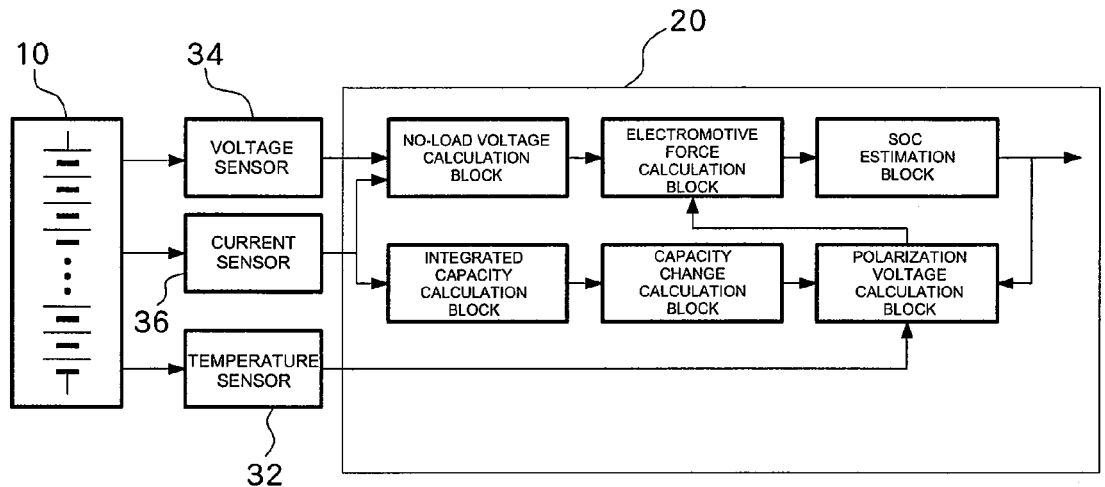
FIG. 2 is a functional block diagram of a battery ECU of the embodiment.

FIG. 2 shows a functional block diagram of the battery ECU 20. The battery ECU 20 has a no-load voltage calculation block, an electromotive force calculation block, an SOC estimation block, an integrated capacity calculation block, a capacity change calculation block, and a polarization calculation block.

The voltage data Vb(n) pertaining to the secondary battery 10 detected by the voltage sensor 34 is fed to the no-load voltage calculation block. The current data I(n) pertaining to the secondary battery 10 detected by the current sensor 36 are fed to the no-load voltage calculation block and also to the integrated capacity calculation block. The temperature data Tb(n) pertaining to the secondary battery 10 detected by the temperature sensor 32 are fed to the polarization voltage calculation block.

The integrated capacity calculation block integrates the current data I(n), to thus calculate integrated capacity Q in a predetermined period. The integrated capacity calculation block outputs the thus-calculated capacity Q to the capacity change calculation block.

The capacity change calculation block calculates a capacity change ΔQ in integrated capacity Q occurred in a predetermined period (e.g., one minute). The capacity change calculation block outputs the thus-calculated capacity change ΔQ in integrated capacity to the polarization calculation block.

Figure 3:
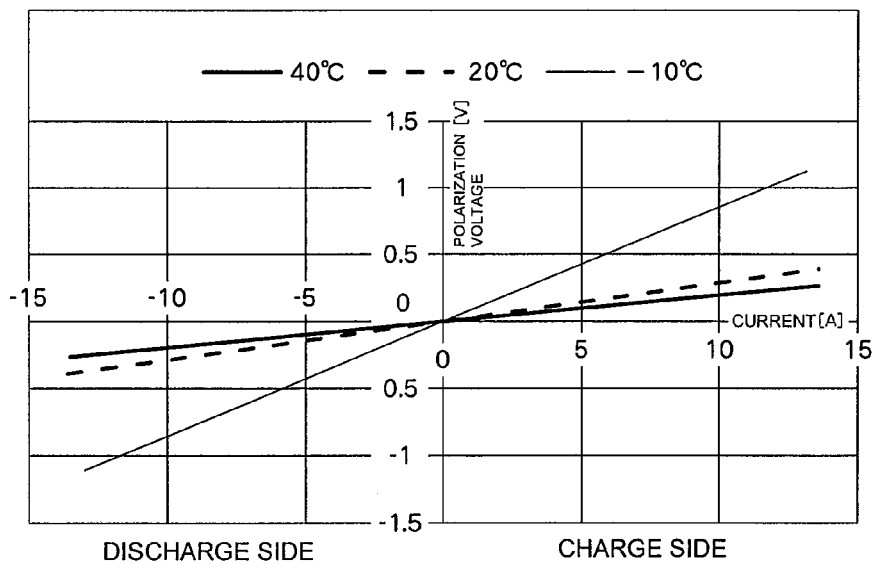
FIG. 3 is a graph showing a relationship between a charge/discharge current and a polarization voltage achieved while a temperature is taken as a parameter.

The polarization calculation block calculates a polarization voltage Vp based on the capacity change ΔQ in integrated capacity. The polarization calculation block also determines whether or not the calculated polarization voltage falls within a range between the lower limit value and the upper limit value, thereby determining whether or not the calculated polarization voltage is an appropriate value. When the calculated polarization voltage is determined not to be appropriate, a correction is made to the polarization voltage. FIG. 3 shows a relationship between a charge/discharge current and a polarization voltage of the secondary battery 10 while the temperature of the secondary battery 10 is taken as a parameter. In the drawing, a horizontal axis represents a charge/discharge current (a plus side of the axis depicts a charge side, whilst a minus side of the axis depicts a discharge side). A vertical axis represents a polarization voltage (a plus side of the axis depicts a charge side, whilst a minus side of the axis depicts a discharge side). There is illustrated a relationship between the charge/discharge current and the polarization voltage achieved when the temperature of the secondary battery 10 is −10° C., 20° C., and 40° C. The higher the temperature of the secondary battery 10, the smaller a value (an absolute value) of the polarization voltage. In the present embodiment, it is determined whether or not the polarization voltage determined by reference to a lookup table is appropriate, by taking into account such a temperature characteristic of the secondary battery 10. Therefore, the upper limit value and the lower limit value are not fixed but are adaptively changed so as to be corrected. Additional descriptions will be later provided to the upper limit value and the lower limit value. The polarization voltage calculation block outputs the thus-determined polarization voltage Vp to the electromotive force calculation block.

The no-load voltage calculation block subjects the voltage data Vb(n) and the current data I(n), which have been detected as a data set, to statistical processing using the least square method, thereby determining a primary voltage-current line. A no-load voltage is calculated as a voltage (a V intercept) for a case where the current is zero. The no-load voltage calculation block outputs the thus-calculated no-load voltage to the electromotive force calculation block.

The electromotive force calculation block calculates electromotive force of the secondary battery 10 based on the calculated no-load voltage and the polarization voltage calculated by the polarization voltage calculation block. Specifically, the electromotive force is calculated by subtracting the polarization voltage from the no-load voltage. During charging operation, the electromotive force becomes smaller than the no-load voltage by an amount equivalent to an absolute value of the polarization voltage. During discharging operation, the electromotive force becomes greater than the no-load voltage by an amount equivalent to the absolute value of the polarization voltage. The electromotive force calculation block outputs the thus-calculated electromotive force to the SOC estimation block.

The SOC estimation block previously stores the relationship between the electromotive force and the SOC of the secondary battery 10 as the lookup table in memory. The SOC estimation block determines an SOC commensurate with the electromotive force fed based on the electromotive force estimation block by reference to the memory. Further, the SOC estimation block calculates another SOC based on an already-calculated previous SOC estimation value and the capacity change; estimates a current SOC based on these two SOCs; and outputs an estimation result to the HV-ECU 40.

Figure 4A:
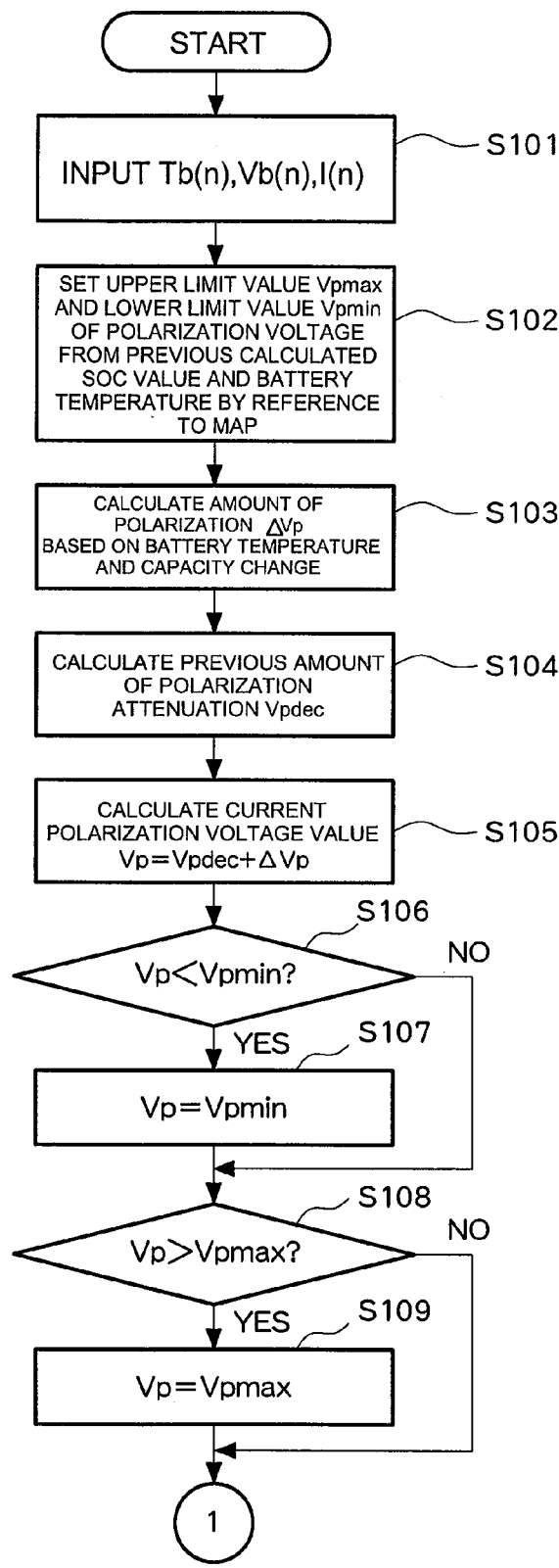
FIG. 4A is a processing flowchart (Part 1) of the embodiment.
Figure 4B:
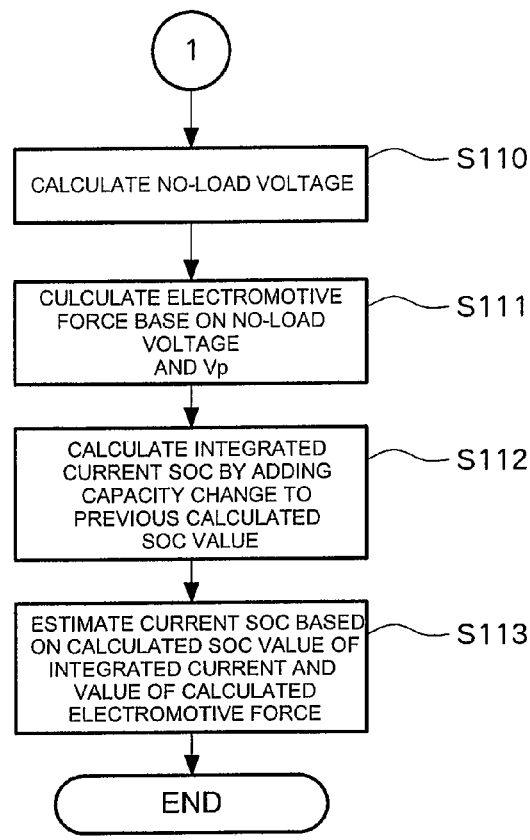
FIG. 4B is a processing flowchart (Part 2) of the embodiment.

FIGS. 4A and 4B show detailed processing flowcharts employed by the battery ECU 20 of the present embodiment. First, in FIG. 4A, the temperature data Tb(n), the voltage data Vb(n), and the current data I(n) are input (S101). Next, the polarization voltage calculation block sets an upper limit value Vpmax and a lower limit value Vpmin of the polarization voltage according to a previously-calculated SOC value (a calculated SOC value is sequentially stored, in advance, in memory of the polarization voltage calculation block) and the temperature data Tb(n) (S102). Specifically, the lookup table showing a relationship between the previous SOC value, the temperature data Tb(n) and the upper limit value Vpmax, the lower limit value Vpmin are previously stored in the memory. The upper limit value Vpmax and the lower limit value Vpmin commensurate with the previous SOC value and the current temperature data Tb(n) are set by reference to the memory.

Figure 5:
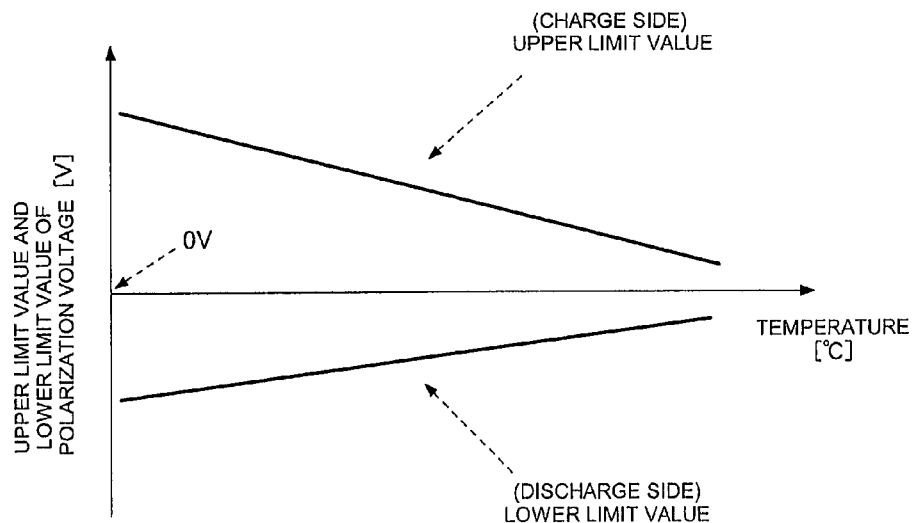
FIG. 5 is a graph showing a relationship between a temperature and an upper limit value, a lower limit value of the polarization voltage.

FIG. 5 shows a relationship between the temperature of the secondary battery 10 and the upper limit value Vpmax and a relationship between the temperature of the secondary battery 10 and the lower limit value Vpmin. The upper limit value Vpmax is an upper limit value of a charge-side polarization voltage, and the lower limit value Vpmin is a lower limit value of a discharge-side polarization voltage. As shown in FIG. 3, a value (the absolute value) of the polarization voltage tends to become smaller as the temperature of the secondary battery 10 increases. Accordingly, allowing for the tendency, the absolute value of the upper limit value Vpmax and the absolute value of the lower limit value Vpmi are set so as to become smaller as the temperature of the secondary battery 10 increases. The upper limit value Vpmax and the lower limit value Vpmin are adaptively changed according to the temperature, whereby the polarization voltage Vp can be calculated more accurately according to the temperature characteristic of the secondary battery 10.

Figure 6:
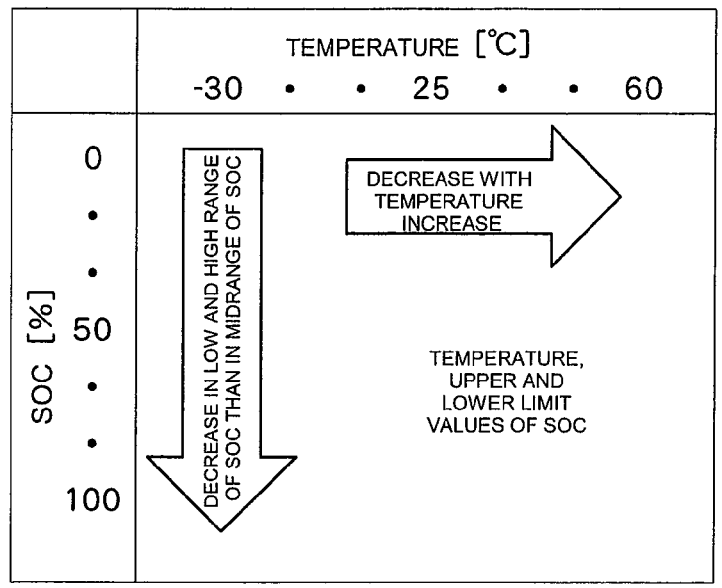
FIG. 6 is a graph showing a two dimensional able of the upper limit value and the lower limit value of the polarization voltage.

FIG. 6 schematically shows an example lookup table. The lookup table is a two-dimensional table (map) that defines the upper limit value Vpmax and the lower limit value Vpmin commensurate with the previous SOC value and the current temperature data Tb(n). Both the absolute value of the upper limit value Vpmax and the absolute value of the lower limit value Vpmin are set so as to become smaller as the temperature becomes higher and are varied according to the previous SOC value. Specifically, both the absolute value of the upper limit value Vpmax and the absolute value of the lower limit value Vpmin are set in such a way that the SOC value becomes relatively smaller in both the low and high ranges than in the midrange. The reason why the absolute value of the upper limit value Vpmax and the absolute value of the lower limit value Vpmin are made smaller as the temperature increases is that the absolute value of the polarization voltage becomes smaller as the temperature increases as mentioned above. Further, the absolute value of the upper limit value Vpmax and the absolute value of the lower limit value Vpmin are made smaller in such a way that the SOC value becomes relatively smaller in the low and high ranges than in the midrange. The reason for this is that the test clearly shows that the polarization voltage becomes relatively less likely to arise in the low and high ranges in the midrange. Some types of batteries show that a polarization voltage becomes less likely to arise as the SOC value increases. In this case, the absolute value of the upper limit value Vpmax and the absolute value of the lower limit value Vpmin can also be made smaller as the SOC value increases.

Turning back to FIG. 4, after the upper limit value Vpmax and the lower limit value Vpmin are set, the polarization voltage calculation block calculates an amount of polarization developed $\Delta Vp$ by use of the battery temperature Tb(n) and the capacity change $\Delta Q$ (S103). Further, the polarization voltage calculation block calculates an amount of previous polarization attenuation Vpdec (S104). The polarization voltage calculation block adds the amount of polarization developed $\Delta Vp$ to an attenuation processing value (an amount of attenuation) Vpdec, thereby calculating a current polarization voltage Vp (S105).

Although the polarization voltage calculation method per se has already been known as described in connection with; for instance, JP 2008-180692 A, the method is again described below. When charging the secondary battery 10 with a constant current is made continual, the polarization voltage Vp gradually increases. Even after completion of charging operation, the increase in polarization voltage does not immediately stop, and the polarization voltage then gradually decreases to zero. In short, the polarization voltage Vp includes the amount of polarization developed $\Delta Vp$ that is a component appearing from when charging is started by use of a constant current until when charging operation ends and the amount of attenuation Vpdec that is a component appearing after stoppage of charging operation. In reality, the secondary battery 10 mounted in the hybrid electric vehicle is not charged with a constant current but frequently, repeatedly undergoes charging and discharging in a short time. Therefore, the amount of polarization developed $\Delta Vp$ is obtained by approximately multiplying an integrated amount of charge/discharge current I acquired in a given period of time by a coefficient "h" and imposing a limit on a multiplication result by means of a certain value. Namely, the amount of polarization developed $\Delta Vp$ is calculated by $$\Delta Vp = h \times \int I dt.$$

The coefficient "h" is calculated by means of a function previously determined by a test while the battery temperature was taken as a parameter. The term $\int I dt$ is an integrated value of the current data I(n).

In the meantime, the amount of attenuation Vpdec is a combination of "n" components (A1, A2, . . . , An) ranging from a component that attenuates in a short period to a component that attenuates in a long period. Since an attenuation rate of each of the components is expressed by $\exp(-t/Tn)$, an attenuation rate of the combined components is expressed as follows:

Attenuation rate=$A1 \times \exp(-t/T1) + A2 \times \exp(-t/T2) + \ldots + An \times \exp(-t/Tn)$.

There exist a relationship of (A1, A2, . . . An)>0 and a relationship of A1+A2+ . . . +An=1. A1 to An and T1 to Tn are previously determined from the battery characteristics by means of a test. Reference symbol "t" denotes a time elapsed since charge or discharge of the secondary battery 10 ended.

Since the polarization voltage attenuates with respect to a polarization voltage developed during a charge or discharge period, the amount of attenuation Vpdec is defined as Vpdec=$\Delta Vp \times$ an attenuation rate.

The polarization voltage Vp is calculated by adding the amount of polarization developed $\Delta Vp$, which is calculated as mentioned above, to the amount of attenuation Vpdec.

After calculation of the polarization voltage Vp, the polarization voltage calculation block compares the upper limit value Vpmax and the lower limit value Vpmin, which have been set in S102 by reference to the lookup table, with the polarization voltage Vp, respectively. Specifically, a determination is first made as to whether or not Vp<Vpmin stands (S106). When Vp<Vpmin stands, it signifies that the polarization voltage Vp falls below the lower limit value (in other words, the absolute value of Vp exceeds the absolute value of the lower limit value). Therefore, the calculated polarization voltage Vp is replaced with the lower limit value Vpmin (S107). Next, a determination is made as to whether or not Vp>Vpmax stands (S108). When Vp>Vpmax stands, it signifies that the polarization voltage Vp exceeds the upper limit value. Therefore, the calculated polarization voltage Vp is replaced with the upper limit value Vpmax (S109). When the calculated polarization voltage Vp falls within a range from the lower limit value to the upper limit value; namely, Vpmin$\leq$Vp$\leq$Vpmax exists, the polarization voltage is maintained intact without being replaced. The polarization voltage calculation block calculates the polarization voltage Vp as mentioned above. The polarization voltage calculation block makes a correction to the polarization voltage Vp calculated based on the current data I(n) by use of the upper limit value Vpmax and the lower limit value Vpmin so as to fall within the range between the lower limit value and the upper limit value.

Figure 7:
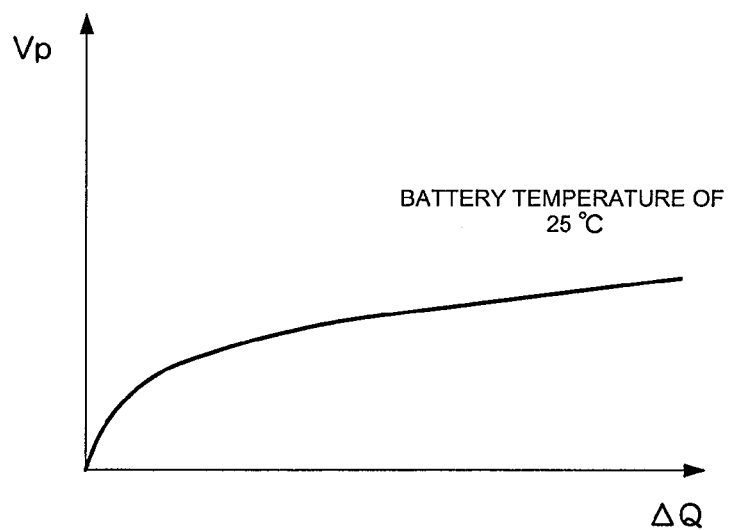
FIG. 7 is a graph showing a relationship between a capacity change and the polarization voltage.

The polarization voltage calculation block can also store beforehand, in memory, a lookup table that shows a relationship between the capacity change $\Delta Q$ in integrated capacity and the polarization voltage Vp while the temperature of the secondary battery 10 is taken as a parameter. The polarization voltage calculation block can also determine the polarization voltage Vp based on the temperature data and the capacity change $\Delta Q$ calculated by the capacity change calculation block. FIG. 7 shows a relationship between the capacity change $\Delta Q$ and the polarization voltage Vp as an example; namely, a case where the battery temperature is 25° C.

As shown in FIG. 4B, the no-load voltage calculation block calculates a no-load voltage based on the data set consisting of the voltage data Vb(n) and the current data I(n) (S110).

Figure 8:
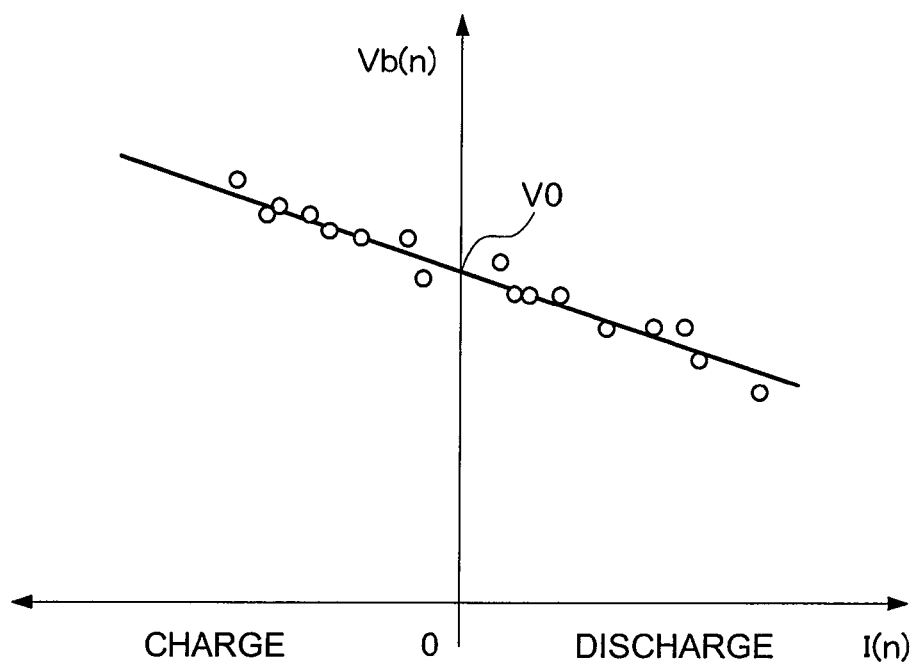
FIG. 8 is a graph showing a method for calculating a no-load voltage.

FIG. 8 shows a result of plotting of the data set including the voltage data Vb(n) and the current data I(n). A primary voltage-current line (an approximate line) is determined through statistical processing using the least square method, and the no-load voltage V0 is calculated as a voltage (a V intercept) for a case where the electric current is zero.

The no-load voltage calculate block can also select only an effective data set based on the data sets, to thus calculate no-load voltage V0. For instance, when the value of the current data I(n) falls within a predetermined range and when the capacity change ΔQ in integrated capacity appearing in the course of acquisition of a data set falls in a predetermined range, the data set is deemed to be valid and precluded in other cases.

Turning back to FIG. 4B, after calculation of the no-load voltage V0, the electromotive force calculation block calculates electromotive force based on the no-load voltage V0 and the polarization voltage Vp. (S111). Specifically, the electromotive force calculation block subtracts the polarization voltage Vp from the no-load voltage V0, thereby calculating electromotive force.

Figure 9:
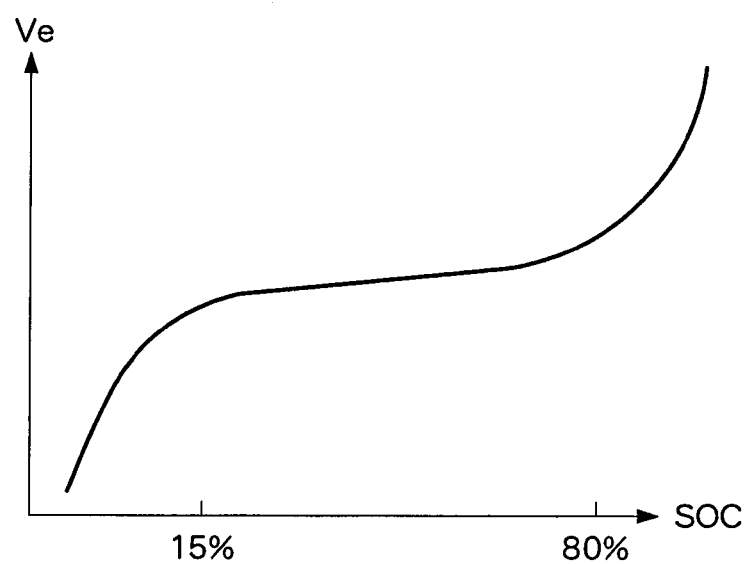
FIG. 9 is a graph showing a relationship between electromotive force and an SOC value.

Next, the SOC estimation block adds the capacity change ΔQ to the previous SOC value, thereby calculating an SOC value of an integrated current (S112). The SOC estimation block determines an SOC value commensurate with the calculated electromotive force from the electromotive force calculated by the electromotive force calculation block, by reference to the previously-stored lookup table showing a relationship between the electromotive force and the SOC. FIG. 9 shows, as an example, a relationship between the electromotive force Ve and the SOC value. The current SOC value is estimated based on the SOC value of the integrated current and the SOC value determined from the electromotive force (S113). Specifically, the SOC estimation block calculates an average of the SOC value of the integrated current and the SOC value determined from the electromotive force, thereby estimating a current SOC value. The SOC estimation block can also estimate a current SOC value based on a weighted average of the SOC value of the integrated current and the electromotive force; or can also take an SOC value determined from electromotive force as a current SOC value without modifications. The SOC estimation block outputs an estimated SOC value to the HV-ECU 40. The SOC estimation block outputs the current SOC value to the polarization voltage calculation block. The polarization voltage calculation block stores the current SOC value fed from the SOC estimation block in the memory. The current SOC value stored in the memory is used for setting the upper limit value Vpmax and the lower limit value Vpmin employed at the time of calculation of the next polarization voltage.

As mentioned above, in the present embodiment, the upper limit value and the lower limit value allowing for the characteristic of the secondary battery 10 are used at the time of calculation of the polarization voltage Vp used for calculating electromotive force of the secondary battery 10 required to estimate an SOC value, whereby the accuracy of calculation of the polarization voltage Vp can be improved. The electromotive force is calculated by subtracting the polarization voltage Vp from the no-load voltage V0. As a result of the polarization voltage Vp being calculated with high accuracy, the accuracy of calculation of electromotive force is enhanced, and the accuracy of calculation of the SOC value is consequently improved, as well.

Although the embodiment of the present invention has been described thus far, the present invention is not limited to the embodiment and susceptible to various modifications.

As shown in FIG. 6, in the present embodiment, the table used for setting the upper limit value Vpmax and the lower limit value Vpmin of the polarization voltage Vp is taken as; for instance, a two-dimensional table pertaining to a current temperature and a previous SOC value. However, since a positive correlation exists between an SOC value and a terminal voltage, the table can also be taken as a two-dimensional table pertaining to a current temperature and a previous terminal voltage. Specifically, the absolute value of the upper limit value Vpmax and the absolute value of the lower limit value are set so as to become relatively smaller in the low and high ranges than in the midrange as the temperature and the terminal voltage increase. Depending on a battery type, the absolute value of the upper limit value Vpmax and the absolute value of the lower limit value can also be set so as to become smaller as the temperature and the terminal voltage increase.

In the present embodiment, the no-load voltage calculation block subjects the data set to statistical processing by means of the least square method, thereby calculating the no-load voltage V0. In relation to the calculated no-load voltage V0, a discrete value of a data set corresponding to an approximate line of the no-load voltage is determined. A determination is made as to whether or not the discrete value falls within a predetermined range. Alternatively, a correlation coefficient between the approximate line and the data set is determined. When the correlation coefficient is the predetermined value or more, the no load voltage V0 can be made valid, whereby the accuracy of calculation of the no-load voltage can be assured. The electromotive force is calculated based on the no-load voltage V0 and the polarization voltage Vp. In the present embodiment, the accuracy of the no-load voltage V0 is also additionally assured, so that the accuracy of calculation of electromotive force is enhanced.

In the present embodiment, the upper limit value Vpmax and the lower limit value Vpmin of the polarization voltage Vp are set by use of the two-dimensional table. However, a reference upper limit value and a reference lower limit value for a certain reference temperature can also be previously set. The reference upper limit value and the lower limit value can thereby be changed according to an amount of temperature change from the reference temperature, thereby adaptively setting the upper limit value and the lower limit value according to the temperature. For instance, a temperature of 25° C. is taken as a reference, and the reference upper limit value and the reference lower limit value that are acquired at this time are previously set, and the reference upper limit value and the reference lower limit value are adjusted increasingly or decreasingly according to the amount of a temperature change from 25° C. When the temperature is 25° C. or more, the absolute value of the reference upper limit value and the absolute value of the reference lower limit value are adjusted decreasingly. On the contrary, when the temperature is 25° C. or less, the absolute value of the reference upper limit value and the absolute value of the reference lower limit value are adjusted increasingly. In the embodiment, expressions, such as the upper limit value and the lower limit value, are used. However, provided that the upper limit value is taken as a charge-side threshold value and that the lower limit value is taken as a discharge-side threshold value, setting of the upper limit value and the lower limit value can also be expressed as setting of a threshold value or allowable value for a polarization voltage in a period of charging operation and in a period of discharging operation.

In the present embodiment, the state of charge (SOC) is estimated. However, the state of charge (SOC) also includes remaining capacity of the secondary battery 10.

Moreover, in the present embodiment, the SOC value is estimated based on the electromotive force calculated by the electromotive force estimation block. However, as described in connection with JP 2008-180692 A, a correction can also be made to the electromotive force calculated by the electromotive force calculation block such that the electromotive force does not exceed an allowable amount of change from the previous electromotive force serving as a reference, whereby an SOC value can be estimated based on the corrected electromotive force. In the present embodiment, however, the polarization voltage Vp can be calculated with high accuracy, and the calculation accuracy of the electromotive force is also assured thereby. Therefore, such a correction to electromotive force will generally become obviated. The ability to omit electromotive force correction processing is one of the advantages yielded by the present embodiment.

What is claimed is:

1. A polarization voltage calculation apparatus that calculates a polarization voltage of a secondary battery, comprising:
   polarization voltage calculation means that calculates a polarization voltage based on an electric current flowing into the secondary battery;
   threshold value setting means that sets a threshold value for the polarization voltage; and
   polarization voltage correction means that corrects the polarization voltage by comparing the calculated polarization voltage with the threshold value, wherein
   the threshold value is set according to a temperature characteristic of the secondary battery in such a way that an absolute value of the threshold value becomes smaller as a temperature increases.

2. The polarization voltage calculation apparatus according to claim 1, wherein the threshold value is also set according to a previous state of charge (SOC) of the secondary battery in such a way that an absolute value of the threshold value becomes smaller when the previous state of charge (SOC) is relatively in low and high ranges than in a midrange.

3. The polarization voltage calculation apparatus according to claim 1, wherein the threshold value is also set according to a terminal voltage of the secondary battery in such a way that an absolute value of the threshold value becomes smaller when the terminal voltage is relatively in a low range and a high range than in a midrange.

4. The polarization voltage calculation apparatus according to claim 1, wherein the polarization voltage correction means replaces the polarization voltage with the threshold value when the calculated polarization voltage exceeds an absolute value of the threshold value, and maintains the polarization voltage intact when an absolute value of the calculated polarization voltage is equal to the threshold value or less.

5. The polarization voltage calculation apparatus according to claim 1, wherein the threshold value includes a charge-side threshold value and a discharge-side threshold value.

6. An apparatus that estimates a state of charge (SOC) of a secondary battery comprising:
   polarization voltage calculation means that calculates a polarization voltage based on an electric current flowing into the secondary battery;
   threshold value setting means that sets a threshold value for the polarization voltage;
   polarization voltage correction means that corrects the polarization voltage by comparing the calculated polarization voltage with the threshold value;
   no-load voltage calculation means that calculates a no-load voltage representing a terminal voltage of the secondary battery acquired when an electric current flowing into the secondary battery is zero;
   electromotive force calculation means that calculates electromotive force of the secondary battery based on the calculated no-load voltage and the calculated polarization voltage; and
   SOC calculation means that calculates the state of charge (SOC) of the secondary battery based on the calculated electromotive force, wherein
   the threshold value is set according to a temperature characteristic of the secondary battery in such a way that an absolute value of the threshold value becomes smaller as a temperature increases.

7. The apparatus that estimates a state of charge (SOC) of a secondary battery according to claim 6, wherein the threshold value is also set according to a previous state of charge (SOC) of the secondary battery in such a way that an absolute value of the threshold value becomes smaller when the previous state of charge (SOC) is relatively in low and high ranges than in a midrange.

8. The apparatus that estimates a state of charge (SOC) of a secondary battery according to claim 6, wherein the threshold value is also set according to a terminal voltage of the secondary battery in such a way that an absolute value of the threshold value becomes smaller when the terminal voltage is relatively in low and high ranges than in a midrange.

9. The apparatus that estimates a state of charge (SOC) of a secondary battery according to claim 6, wherein the polarization voltage correction means replaces the polarization voltage with the threshold value when the calculated polarization voltage exceeds an absolute value of the threshold value, and maintains the polarization voltage intact when an absolute value of the calculated polarization voltage is equal to the threshold value or less.

10. The apparatus that estimates a state of charge (SOC) of a secondary battery according to claim 6, wherein the threshold value includes a charge-side threshold value and a discharge-side threshold value.

* * * * *